United States Patent
Dan et al.

(10) Patent No.: US 10,847,987 B2
(45) Date of Patent: Nov. 24, 2020

(54) HEATING SYSTEM AND POWER SWITCH DEVICE

(71) Applicant: Contemporary Amperex Technology Co., Limited, Ningde (CN)

(72) Inventors: Zhimin Dan, Ningde (CN); Wei Zhang, Ningde (CN); Yizhen Hou, Ningde (CN); Xiyang Zuo, Ningde (CN); Xingyuan Wu, Ningde (CN); Taosheng Zhu, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 116 days.

(21) Appl. No.: 16/235,274

(22) Filed: Dec. 28, 2018

(65) Prior Publication Data

US 2019/0363562 A1   Nov. 28, 2019

(30) Foreign Application Priority Data

May 22, 2018   (CN) .......................... 2018 1 0495005

(51) Int. Cl.
*H02J 7/00* (2006.01)
*H01M 10/615* (2014.01)
(Continued)

(52) U.S. Cl.
CPC ....... *H02J 7/00714* (2020.01); *H01M 10/425* (2013.01); *H01M 10/46* (2013.01);
(Continued)

(58) Field of Classification Search
CPC .... H02J 7/00714; H02J 7/0013; H02J 7/0068; H01M 10/615; H01M 10/425;
(Continued)

(56) References Cited

U.S. PATENT DOCUMENTS 8,836,277 B2 *   9/2014   Xu .......................... H02J 7/342
                                              320/107
9,059,125 B2 *   6/2015   Xu .......................... H02J 7/342
(Continued)

FOREIGN PATENT DOCUMENTS

CN   102074752 A   5/2011
CN   102170031 A   8/2011
(Continued)

OTHER PUBLICATIONS

The First Official Action and search report dated Aug. 2, 2019 for Chinese application No. 201810495005.4, 12 pages.
(Continued)

*Primary Examiner* — M Baye Diao
(74) *Attorney, Agent, or Firm* — Law Offices of Liaoteng Wang

(57) ABSTRACT

The embodiments of the present disclosure provide a heating system and a power switch device. A switch module of the heating system includes a first switch unit and a second switch unit; a control module controls that the first switch unit is switched on and the second switch unit is switched off, so that a battery pack, the first switch unit and an energy storage module form a discharge circuit, the control module controls that the first switch unit is switched off and the second switch unit is switched on, so that the energy storage module, the second switch unit and the battery pack form a charge circuit; a buffer module includes a first buffer unit and a second buffer unit.

10 Claims, 10 Drawing Sheets

(51) Int. Cl.
    *H01M 10/42*     (2006.01)
    *H01M 10/46*     (2006.01)
    *H03K 17/567*     (2006.01)
    *H03K 17/60*     (2006.01)

(52) U.S. Cl.
    CPC ......... *H01M 10/615* (2015.04); *H02J 7/0013* (2013.01); *H03K 17/567* (2013.01); *H03K 17/602* (2013.01); *H01M 2010/4271* (2013.01)

(58) Field of Classification Search
    CPC ......... H01M 10/46; H01M 2010/4271; H01M 10/637; H01M 10/633; H01M 10/667; H03K 17/567; H03K 17/602; H03K 17/0812
    USPC ......................................................... 320/128
    See application file for complete search history.

(56) References Cited

U.S. PATENT DOCUMENTS

| | | | |
|---|---|---|---|
| 9,093,413 B2* | 7/2015 | Xu | H01L 23/345 |
| 9,136,714 B2* | 9/2015 | Tsai | H02J 7/0042 |
| 2009/0066402 A1 | 3/2009 | Hiyama | |
| 2011/0144861 A1 | 6/2011 | Lakirovich et al. | |
| 2012/0280659 A1 | 11/2012 | Xu et al. | |
| 2012/0299551 A1 | 11/2012 | Xu et al. | |
| 2016/0173094 A1 | 6/2016 | Choi | |

FOREIGN PATENT DOCUMENTS

| | | |
|---|---|---|
| CN | 102377419 A | 3/2012 |
| CN | 203721843 U | 7/2014 |
| CN | 102742068 B | 1/2016 |
| CN | 104638318 B | 11/2016 |
| CN | 106160446 A | 11/2016 |
| CN | 106464122 A | 2/2017 |
| WO | 2015139132 A1 | 9/2015 |

OTHER PUBLICATIONS

The Second Office Action and search report dated May 7, 2020 for Chinese Application No. 201810495005.4, 14 pages.

The partial European Search Report for European Application No. 19150228.5, dated Aug. 8, 2019, 14 pages.

* cited by examiner

HEATING SYSTEM AND POWER SWITCH DEVICE

CROSS-REFERENCE TO RELATED APPLICATION

This application is based on and claims priority to Chinese Patent Application No. 201810495005.4 filed on May 22, 2018, which is incorporated herein by reference in its entirety.

TECHNICAL FIELD

The present disclosure relates to the field of battery technology, and more particularly to a heating system and a power switch device.

BACKGROUND

At present, when the temperature of a battery pack is lower than the lower bound of the allowable operating temperature range, the battery pack may not be able to work and needs to be heated to the allowable operating temperature range for the battery pack so as to operate normally.

In the prior art, a heating scheme of the battery pack may be that: by controlling a power switch device to charge and discharge an energy storage device, current may flow through internal of a power battery continuously, such that the power battery may be heated. This solution may have the advantage of a fast heating rate.

However, the inventor of the present application found that when switching the power switch device to charge and discharge the energy storage device, the power switch device may be subjected to a large peak voltage due to a rapid current change rate, which may easily cause bad conditions (e.g. the power switch device is overheated and burned) and affect the safe and stable operation of the rapid heating system of the battery pack.

SUMMARY

Embodiments of the present disclosure provide a heating system and a power switch device.

In a first aspect, an embodiment of the present disclosure provides a heating system, including: a battery pack, an energy storage module, a switch module, a control module, and a buffer module; wherein the switch module includes a first switch unit and a second switch unit; the control module controls that the first switch unit is switched on and the second switch unit is switched off, so that the battery pack, the first switch unit and the energy storage module form a discharge circuit; the control module controls that the first switch unit is switched off and the second switch unit is switched on, so that the energy storage module, the second switch unit and the battery pack form a charge circuit; the buffer module includes a first buffer unit and a second buffer unit, wherein the first buffer unit is connected in parallel to both ends of the first switch unit for providing a short-time path when the first switch unit is being switched on or switched off; and the second buffer unit is connected in parallel to both ends of the second switch unit for providing a short-time path when the second switch unit is being switched on or switched off.

In a possible implementation of the first aspect, the first buffer unit includes a RC buffer circuit or a RCD buffer circuit, and the RC buffer circuit or the RCD buffer circuit is connected in parallel to both ends of the first switch unit; the second buffer unit includes a RC buffer circuit or a RCD buffer circuit, and the RC buffer circuit or the RCD buffer circuit is connected in parallel to both ends of the second switch unit.

In a possible implementation of the first aspect, the RCD buffer circuit includes a resistor, a capacitor and a diode; wherein, when the RCD buffer circuit is connected in parallel to both ends of the first switch unit, a first end of the capacitor is connected to a first end of the first switch unit, and a second end of the capacitor is connected to an input end of the diode, an output end of the diode is connected to a second end of the first switch unit, and the resistor is connected in parallel to both ends of the capacitor; when the RCD buffer circuit is connected in parallel to both ends of the second switch unit, a first end of the capacitor is connected to a first end of the second switch unit, and a second end of the capacitor is connected to an output end of the diode, an input end of the diode is connected to a second end of the second switch unit, and the resistor is connected in parallel to both ends of the capacitor.

In a possible implementation of the first aspect, the heating system further includes an absorption capacitor connected in parallel to two electrodes of the battery pack.

In a possible implementation of the first aspect, the first switch unit includes a first power switch device and a second power switch device, the second switch unit includes a third power switch device and a fourth power switch device, and the energy storage module includes a first end, a second end, a third end, and a fourth end; two ends of the first power switch device are respectively connected to a positive electrode of the battery pack and the first end of the energy storage module, two ends of the second power switch device are respectively connected to a negative electrode of the battery pack and the second end of the energy storage module, two ends of the third power switch device are respectively connected to the positive electrode of the battery pack and the third end of the energy storage module, and two ends of the fourth power switch device are respectively connected to the negative electrode of the battery pack and the fourth end of the energy storage module; the control module controls that the first power switch device and the second power switch device are synchronously switched on and the third power switch device and the fourth power switch device are synchronously switched off, so that the battery pack and the energy storage module form a discharge circuit; the control module controls that the first power switch device and the second power switch device are synchronously switched off and the third power switch device and the fourth power switch device are synchronously switched on, so that the energy storage module and the battery pack form a charge circuit; the first buffer unit includes two RC buffer circuits or two RCD buffer circuits, wherein one RC buffer circuit or one RCD buffer circuit is connected in parallel to both ends of the first power switch device, and another RC buffer circuit or another RCD buffer circuit is connected in parallel to both ends of the second power switch device; the second buffer unit includes two RC buffer circuits or two RCD buffer circuits, wherein one RC buffer circuit or one RCD buffer circuit is connected in parallel to both ends of the third power switch device, and another RC buffer circuit or another RCD buffer circuit is connected in parallel to both ends of the fourth power switch device.

In a possible implementation of the first aspect, a working voltage of the first power switch device, the second power switch device, the third power switch device, and the fourth power switch device is greater than a threshold voltage, and the threshold voltage is a peak voltage generated due to a stray inductance of a wire harness between the battery pack and each power switch device when switching between the discharge circuit and the charge circuit.

In a possible implementation of the first aspect, the peak voltage $V_{peak}$ is:

$$V_{peak} = Vdd + (L_1 + L_2) \times \frac{\Delta I}{\Delta t}$$

wherein Vdd is a voltage value of the battery pack, $L_1$ is an inductance value of the energy storage module, $L_2$ is the stray inductance of the wire harness between the battery pack and the power switch device, $\Delta t$ is a duration during which current magnitude and current direction change suddenly when switching between the discharge circuit and the charge circuit, and $\Delta I$ is a current change value within the $\Delta t$.

In a possible implementation of the first aspect, the power switch device includes an insulated gate bipolar transistor IGBT and a drive circuit for driving the IGBT, the drive circuit includes a drive IC and an external gate resistor connected to the drive IC, the external gate resistor is connected to a gate of the IGBT, and the heating system further includes a power amplification module; the power amplification module is disposed between the drive IC and the external gate resistor, and the power amplification module includes a single-stage or multi-stage power amplification circuit for amplifying a current output by the drive IC to meet a demand of the IGBT for a large drive current.

In a possible implementation of the first aspect, the power amplification circuit includes: a NPN triode and a PNP triode; wherein, an output end of the drive IC is respectively connected to a base of the NPN triode and a base of the PNP triode; a collector of the NPN triode is respectively connected to a positive DC voltage source and the drive IC; a collector of the PNP triode is respectively connected to a negative DC voltage source and the drive IC; an emitter of the NPN triode and an emitter of the PNP triode are both connected to the external gate resistor.

In a possible implementation of the first aspect, the power amplification circuit further includes an amplification resistor, one end of the amplification resistor is connected to the output end of the drive IC, and another end of the amplification resistor is respectively connected to the base of the NPN triode and the base of the PNP triode.

In a second aspect, an embodiment of the present disclosure provides a power switch device, wherein the power switch device is an insulated gate bipolar transistor IGBT device including an IGBT and a drive circuit for driving the IGBT; the drive circuit includes a drive IC and an external gate resistor connected to the drive IC; the external gate resistor is connected to a gate of the IGBT; the drive circuit further includes a power amplification module; the power amplification module is disposed between the drive IC and the external gate resistor; and the power amplification module includes a single-stage or multi-stage power amplification circuit for amplifying a current output by the drive IC to meet a demand of the IGBT for a large drive current.

In a possible implementation of the second aspect, the power amplification circuit includes: a NPN triode and a PNP triode; wherein, an output end of the drive IC is respectively connected to a base of the NPN triode and a base of the PNP triode; a collector of the NPN triode is respectively connected to a positive DC voltage source and the drive IC; a collector of the PNP triode is respectively connected to a negative DC voltage source and the drive IC; an emitter of the NPN triode and an emitter of the PNP triode are both connected to the external gate resistor.

In a possible implementation of the second aspect, the power amplification circuit further includes an amplification resistor, one end of the amplification resistor is connected to the output end of the drive IC, and another end of the amplification resistor is respectively connected to the base of the NPN triode and the base of the PNP triode.

BRIEF DESCRIPTION OF THE DRAWINGS

The present disclosure will be better understood from the following detailed description of non-limiting embodiments of the present disclosure with reference to the drawings in which like or similar reference numerals indicate like or similar features.

DETAILED DESCRIPTION

The features and exemplary embodiments of various aspects of the present disclosure will be described in detail below. In the following detailed description, numerous specific details are set forth in order to provide a thorough understanding of the present disclosure.

Embodiments of the present disclosure provide a heating system and a power switch device. The heating principle of the heating system may be that: by controlling on-state and off-state of the power switch device to charge and discharge an energy storage device, current may flow through internal of a battery pack continuously, such that the battery pack may be heated.

Embodiments of the present disclosure relate to the application of the power switch device in the heating system. With respect to the aspects of selecting power switch devices (selecting power), adding a buffer circuit, setting an absorption capacitor, and improving a drive circuit, the switch characteristics of the power switch device may be improved, and the problem of dynamic and static equalization voltage of the power switch device may be solved. Thereby, the power switch device may be more reasonably applied in the heating system of the battery pack, and the rapid heating system of the battery pack may be more stable and safe.

It should be noted that the battery pack in the embodiments of the present disclosure may include one or more battery modules, and each battery module may include at least one battery cell. The battery cell may be a lithium ion battery, a lithium metal battery, a lead acid battery, a nickel cadmium battery, a nickel hydrogen battery, a lithium sulfur battery, a lithium air battery, or a sodium ion battery, which is not limited herein. When the battery pack is used in the field of electric vehicles, the battery pack may also be referred to as a power battery.

The heating system provided by the embodiments of the present disclosure may include a battery pack, an energy storage module, a switch module, a control module, and a buffer module.

Wherein the switch module may include a first switch unit and a second switch unit. The embodiments of the present disclosure may control the first switch unit and the second switch unit jointly, such that the battery pack, the first switch unit and the energy storage module may form a discharge circuit, and the energy storage module, the second switch unit and the battery pack may form a charge circuit. In this way, the energy storage device may be charged or discharged continuously, and current may flow through internal of the battery pack continuously, such that the battery pack may be heated.

The first switch unit and the second switch unit may have multiple specific implementations which will be illustrated by way of example below with reference to FIG. 1 to FIG. 3.

Figure 1:
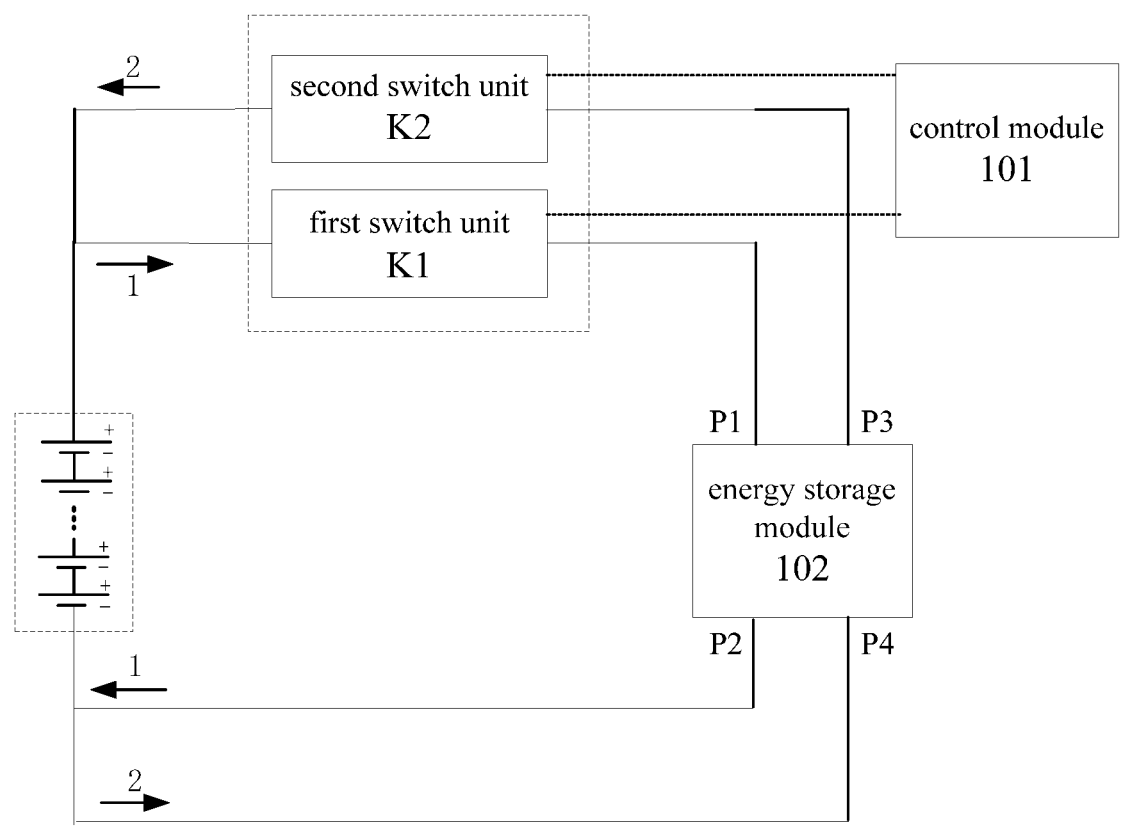
FIG. 1 is a schematic structural diagram of a heating system provided by a first embodiment of the present disclosure.

FIG. 1 is a schematic structural diagram of a heating system provided by a first embodiment of the present disclosure. As shown in FIG. 1, the heating system may include a battery pack, a control module 101, an energy storage module 102, a first switch unit K1, and a second switch unit K2. The energy storage module 102 may include four connection ports P1-P4.

In the example of FIG. 1, the first switch unit K1 may be disposed between a positive electrode of the battery pack and the P1 of the energy storage module 102, and the second switch unit K2 may be disposed between the positive electrode of the battery pack and the P3 of the energy storage module 102.

When the heating system shown in FIG. 1 is in operation, the control module 101 may control that the first switch unit K1 is switched on and the second switch unit K2 is switched off, so that the battery pack, the first switch unit K1 and the energy storage module 102 may form a discharge circuit 1. The flow direction of the current in the discharge circuit may be: flowing out from the positive electrode of the battery pack, passing through the first switch unit K1 and the P1 and P2 of the energy storage module 102 successively, and finally flowing back to the negative electrode of the battery pack. During this process, the battery pack may charge the energy storage module 102, and the current may flow through internal of the battery pack continuously, such that the battery pack may be heated.

After the battery pack discharges towards the energy storage module 102 for a predetermined duration, the control module 101 may also control that the first switch unit K1 is switched off and the second switch unit K2 is switched on, so that the energy storage module 102, the second switch unit K2, and the battery pack may form a charge circuit 2. The flow direction of the current in the charge circuit may be: flowing out from the P3 of the energy storage module 102, passing through the second switch unit K2, the positive electrode of the battery pack and the negative electrode of the battery pack successively, and finally flowing back to the P4 of the energy storage module 102. During this process, the process energy storage module 102 may charge the battery pack, and the current may flow through internal of the battery pack continuously, such that the battery pack may be heated.

Figure 2:
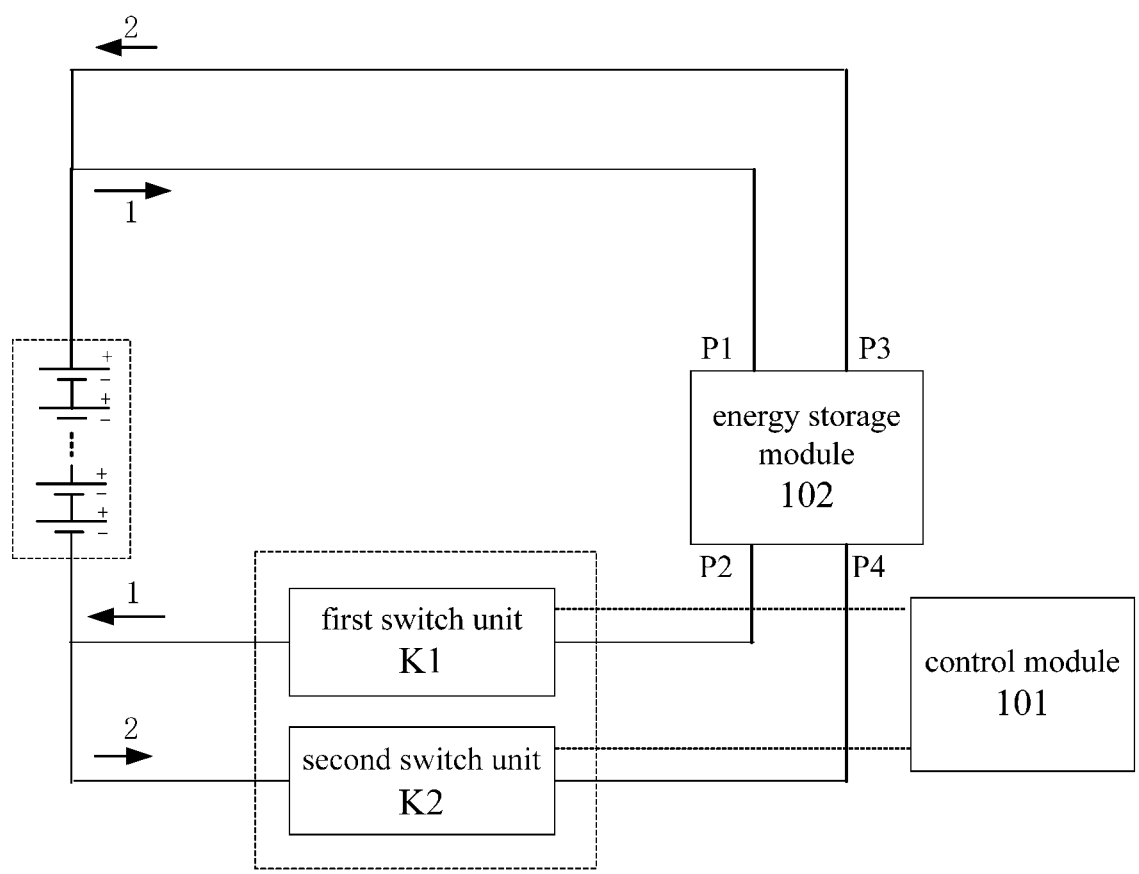
FIG. 2 is a schematic structural diagram of a heating system provided by a second embodiment of the present disclosure.

FIG. 2 is a schematic structural diagram of a heating system provided by a second embodiment of the present disclosure. The difference between FIG. 2 and FIG. 1 may be that, in FIG. 2, the first switch unit K1 is disposed between the negative electrode of the battery pack and the P2 of the energy storage module 102, and the second switch unit K2 is disposed between the negative electrode of the battery pack and the P4 of the energy storage module 102. The operating principle of the first switch unit K1 and the second switch unit K2 in FIG. 2 is the same as that in FIG. 1, and details will not be described herein.

Figure 3:
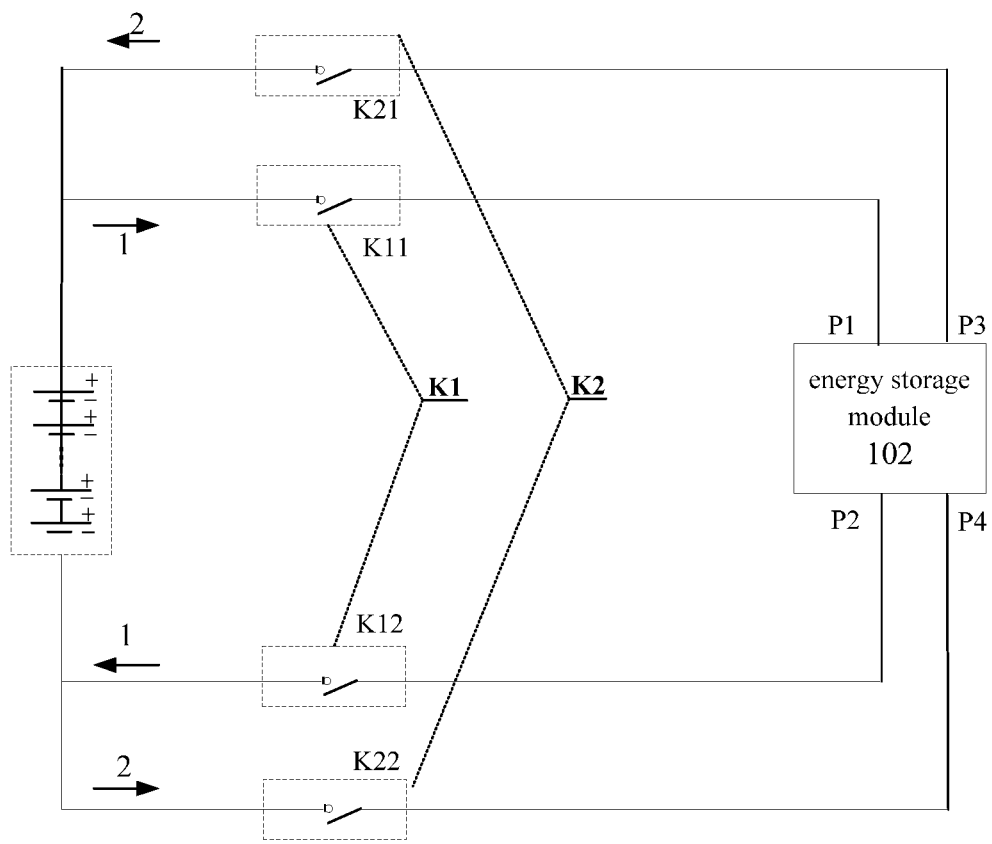
FIG. 3 is a schematic structural diagram of a heating system provided by a third embodiment of the present disclosure.

FIG. 3 is a schematic structural diagram of a heating system provided by a third embodiment of the present disclosure. The difference between FIG. 3 and FIG. 1 may be that, in FIG. 3, the first switch unit K1 may include a power switch device K11 and a power switch device K12. The second switch unit K2 may include a power switch device K21 and a power switch device K22.

Wherein, the two ends of the power switch device K11 may respectively connect to the positive electrode of the battery pack and the P1; the two ends of the power switch device K12 may respectively connect to the negative electrode of the battery pack and the P2; the two ends of the power switch device K21 may respectively connect to the positive electrode of the battery pack and the P3; and the two ends of the power switch device K22 may respectively connect to the negative electrode of the battery pack and the P4.

When the heating system shown in FIG. 3 is in operation, by controlling that the power switch device K11 and the power switch device K12 are synchronously switched on and the power switch device K21 and the power switch device K22 are synchronously switched off, the battery pack, the power switch device K11, the energy storage module 102 and the power switch device K12 may form a discharge circuit 1. The flow direction of the current in the discharge circuit may be: flowing out from the positive electrode of the battery pack, passing through the power switch device K11, the P1 and the P2 of the energy storage module 102 and the power switch device K12 successively, and finally flowing back to the negative electrode of the battery pack. During this process, the battery pack may charge the energy storage module 102, and the current may flow through internal of the battery pack continuously, such that the battery pack may be heated.

After the battery pack discharges towards the energy storage module 102 for a predetermined duration, by controlling that the power switch device K11 and the power switch device K12 are synchronously switched off, and the power switch device K21 and the power switch device K22 are synchronously switched on, the energy storage module 102, the power switch device K21, the battery pack and the power switch device K22 may form a charge circuit 2. The flow direction of the current in the charge circuit may be: flowing out from the P3 of the energy storage module 102, passing through the power switch device K21, the positive electrode and the negative electrode of the battery pack and the power switch device K22 successively, and finally flowing back to the P4 of the energy storage module 102. During this process, the process energy storage module 102 may charge the battery pack, and the current may flow through internal of the battery pack continuously, such that the battery pack may be heated.

Combining FIG. 1 to FIG. 3, the control module 101 may be required to continuously control the switching on and switching off of the first switch unit K1 and the second switch unit K2 so as to switch between the discharge circuit and the charge circuit, such that the battery pack may be heated continuously. Therefore, the switching frequency of the first switch unit K1 and the second switch unit K2 may be very high, and the current change rate may be fast when switching between the discharge circuit and the charge circuit, that is, the current direction and the current magnitude may change suddenly. The power switch device may be subjected to a large peak voltage, which may easily cause bad conditions (e.g. the power switch device is overheated and burned)

Figure 4:
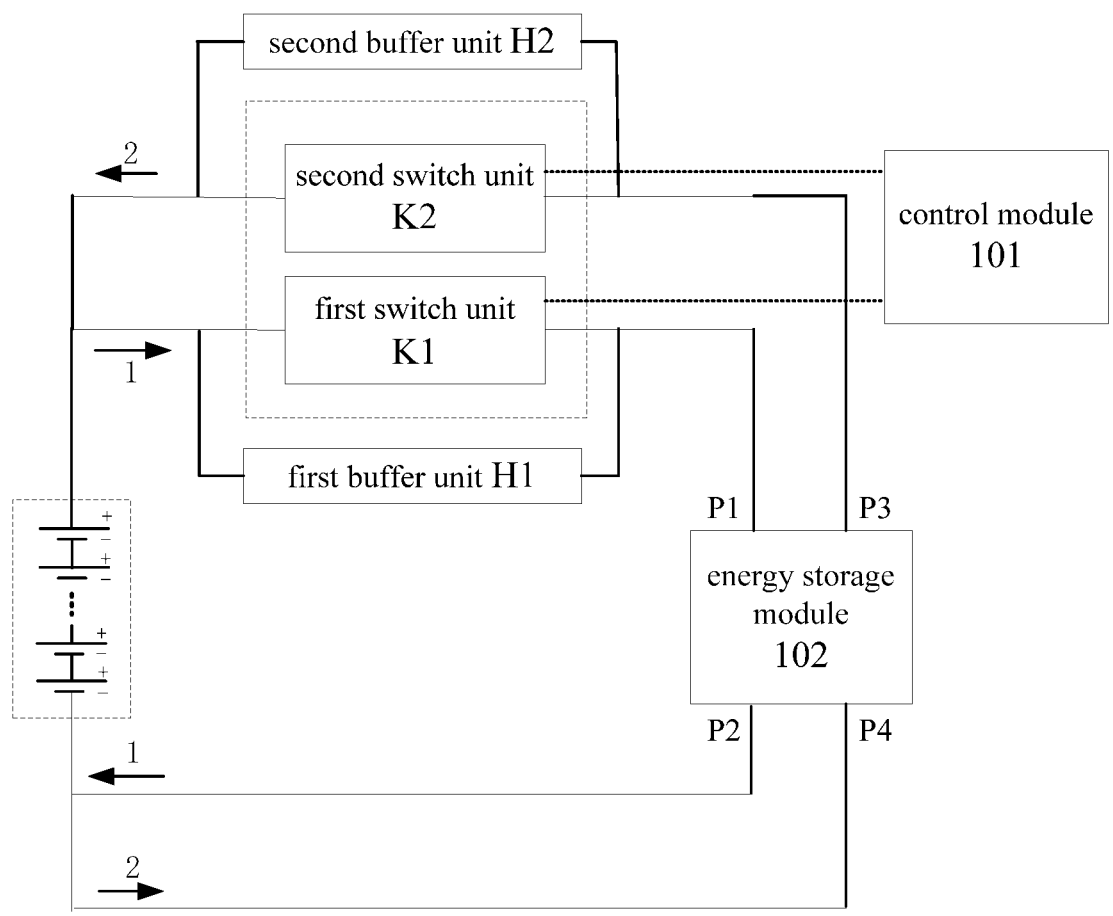
FIG. 4 is a schematic structural diagram of a heating system provided by a fourth embodiment of the present disclosure.

FIG. 4 is a schematic structural diagram of a heating system provided by a fourth embodiment of the present disclosure, which may be used to describe the technical solution in the embodiment of the present disclosure in detail in conjunction with FIG. 1.

As shown in FIG. 4, the heating system in the embodiment of the present disclosure may further include a buffer module. The buffer module may include a first buffer unit H1 and a second buffer unit H2. The first buffer unit H1 may be connected in parallel to both ends of the first switch unit K1 for providing a short-time path for the discharge circuit when the first switch unit K1 is being switched off. The second buffer unit H2 may be connected to both ends of the second switch unit K2 for providing a short-time path for the charge circuit when the second switch unit K2 is being switched off.

The first buffer unit H1 in the embodiment of the present disclosure may provide a short-time path for the discharge circuit when the first switch unit K1 is being switched off, and the second buffer unit H2 may provide a short-time path for the charge circuit when the second switch unit K2 is being switched off, so that the voltage to which the first switch unit K1 or the second switch unit K2 are subjected may be gradually increased during the next switching on, thereby the safe and stable operation of the heating system may be guaranteed.

In one embodiment, the first buffer unit H1 may include a RC buffer circuit or a RCD buffer circuit, and the RC buffer circuit or the RCD buffer circuit may be connected in parallel to both ends of the first switch unit K1.

In one embodiment, the second buffer unit H2 may include a RC buffer circuit or a RCD buffer circuit, and the RC buffer circuit or the RCD buffer circuit may be connected in parallel to both ends of the second switch unit K2.

Figure 5:
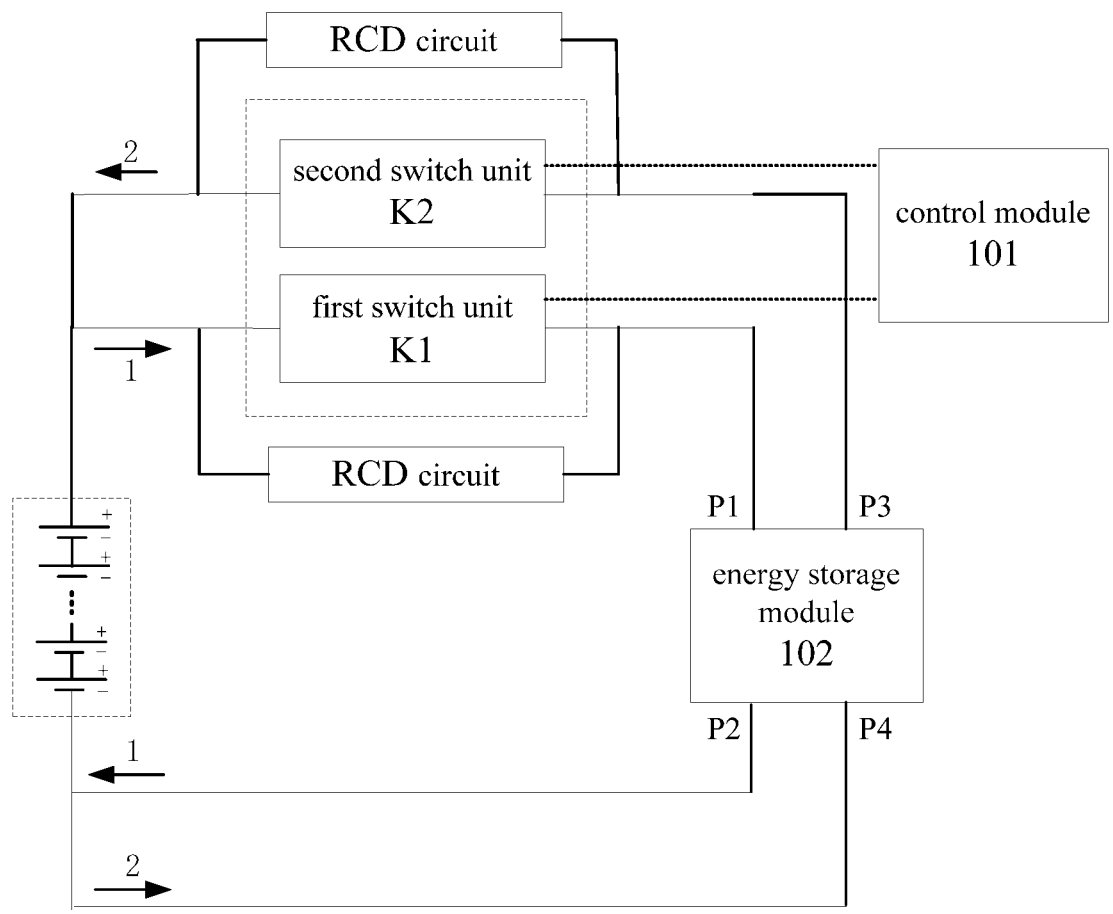
FIG. 5 is a schematic structural diagram of a heating system provided by a fifth embodiment of the present disclosure.

FIG. 5 is a schematic structural diagram of a heating system provided by a fifth embodiment of the present disclosure. The first buffer unit H1 and the second buffer unit H2 shown in FIG. 5 may use a RCD circuit.

Figure 6:
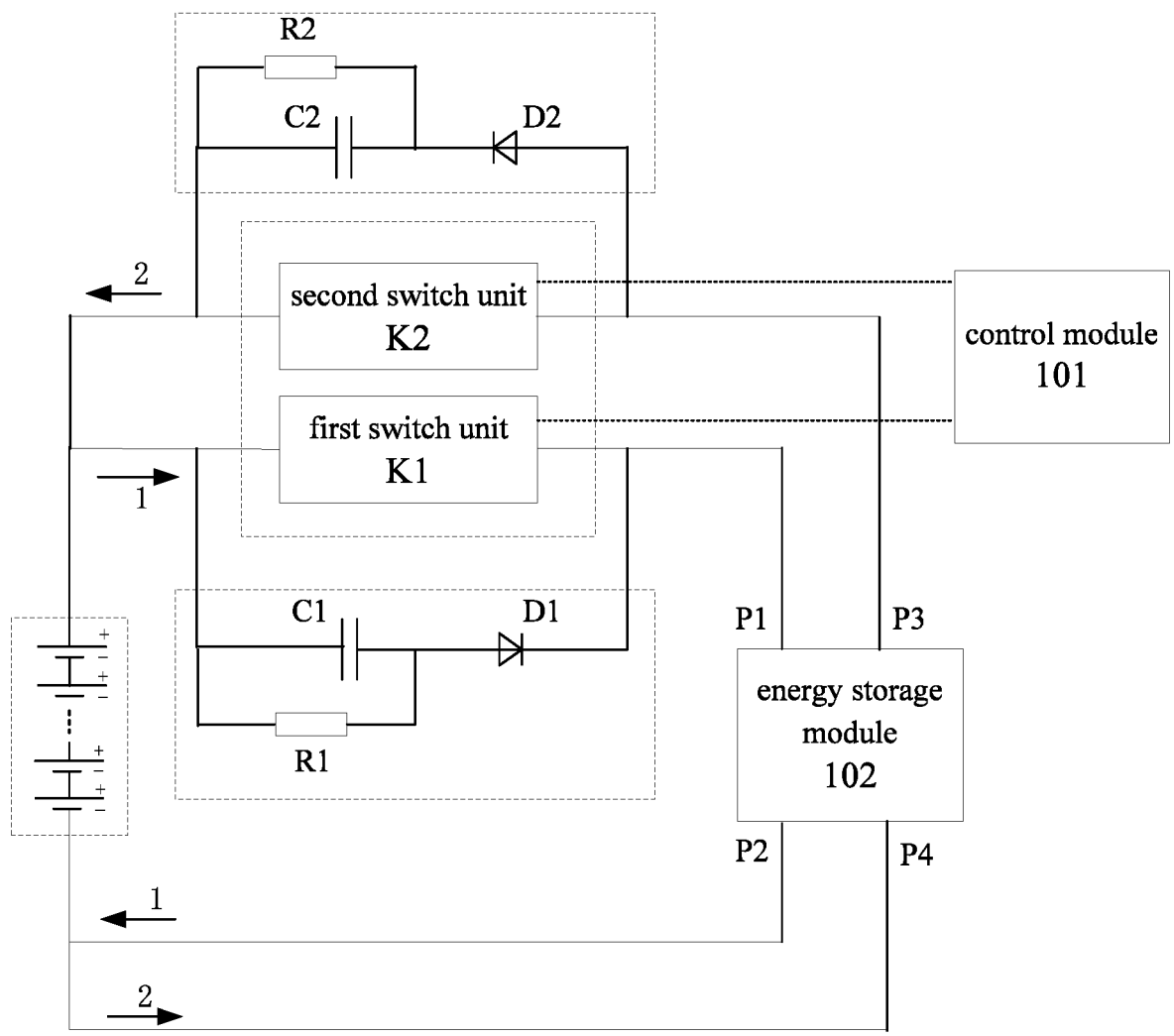
FIG. 6 is a schematic structural diagram of a heating system provided by a sixth embodiment of the present disclosure.

FIG. 6 is a schematic structural diagram of a heating system provided by a sixth embodiment of the present disclosure, which is used to specifically show the components of the RCD circuit. Wherein, the RCD buffer circuit may include a resistor, a capacitor, and a diode.

As shown in FIG. 6, when the RCD buffer circuit is connected in parallel to both ends of the first switch unit K1, a first end of the capacitor C1 may be connected to a first end of the first switch unit K1, and a second end of the capacitor C1 may be connected to an input end of the diode D1, an output end of the diode D1 may be connected to a second end of the first switch unit K1, and the resistor R1 may be connected in parallel to both ends of the capacitor C1. Here, the capacitor C1 may also be referred to as an absorption capacitor.

The buffering principle of the RCD buffer circuit to the first switch unit K1 may be as follows.

When the first switch unit K1 is being switched off, the potential difference across the capacitor C1 may suddenly become large, and a peak voltage generated due to a stray inductance may charge the capacitor C1 through the diode D1, thereby the voltage fluctuation may be suppressed when the first switch unit K1 is being switched off.

When the first switch unit K1 is being switched on, the capacitor C1 may form a discharge circuit through the resistor R1 and the first switch unit K1, and the resistor R1 may consume energy absorbed by the capacitor C1 during the switching off of the first switch unit K1, thereby the voltage fluctuation may be suppressed when the first switch unit K1 is being switched on.

As shown in FIG. 6, when the RCD buffer circuit is connected in parallel to both ends of the second switch unit K2, a first end of the capacitor C2 may be connected to a first end of the second switch unit K2, and a second end of the capacitor C2 may be connected to an output end of the diode D2, an input end of the diode D2 may be connected to a second end of the second switch unit K2, and the resistor R2 may be connected in parallel to both ends of the capacitor C2. Here, the capacitor C2 may also be referred to as an absorption capacitor.

The buffering principle of the RCD buffer circuit to the second switch unit K2 may be as follows.

When the second switch unit K2 is being switched off, the potential difference across the capacitor C2 may suddenly become large, and a peak voltage generated due to a stray inductance may charge the capacitor C2 through the diode D2, and the capacitor C2 may suppress the voltage fluctuation when the second switch unit K2 is being switched off.

When the second switch unit K2 is being switched on, the capacitor C2 may form a discharge circuit through the resistor R2 and the second switch unit K2, and the resistor R2 may consume energy absorbed by the capacitor C2 during the switching off of the second switch unit K2, thereby the voltage fluctuation may be suppressed when the second switch unit K2 is being switched on.

When the power switch devices in the first switch unit K1 and the second switch unit K2 are being switched on next time, the energy stored in the capacitor C may be consumed by the resistor R in the RCD circuit, so the minimum switching on time of the power switch device may be determined by a time constant T of the RC network: $T=R \times C$. Wherein, R is the resistance value of the resistor in the RCD circuit, and C is the capacitance value of the absorption capacitor in the RCD circuit.

In addition, it is considered that when the power switch device is being switched on, the energy stored in the capacitor C will generate a current through the resistor R.

When the current flows through the power switch device, the switching on loss of the power switch device may be correspondingly increased. Here, the diode D may be a Schottky diode, the resistance value of the resistor R may be set as 0.1~20Ω, and the capacitance value of the capacitance C may be set as 0.1~15 uF.

It should be noted that the resistor R, the capacitor C and the diode D in the structure of the RCD buffer circuit may also have other combination manners, which are not limited herein. Furthermore, in addition to the RC buffer circuit and the RCD buffer circuit mentioned in the embodiment of the present disclosure, the buffer circuit used for both ends of the first switch unit K1 and the second switch unit K2 may be a circuit in other structures having a buffer function, which are not limited herein.

Figure 7:
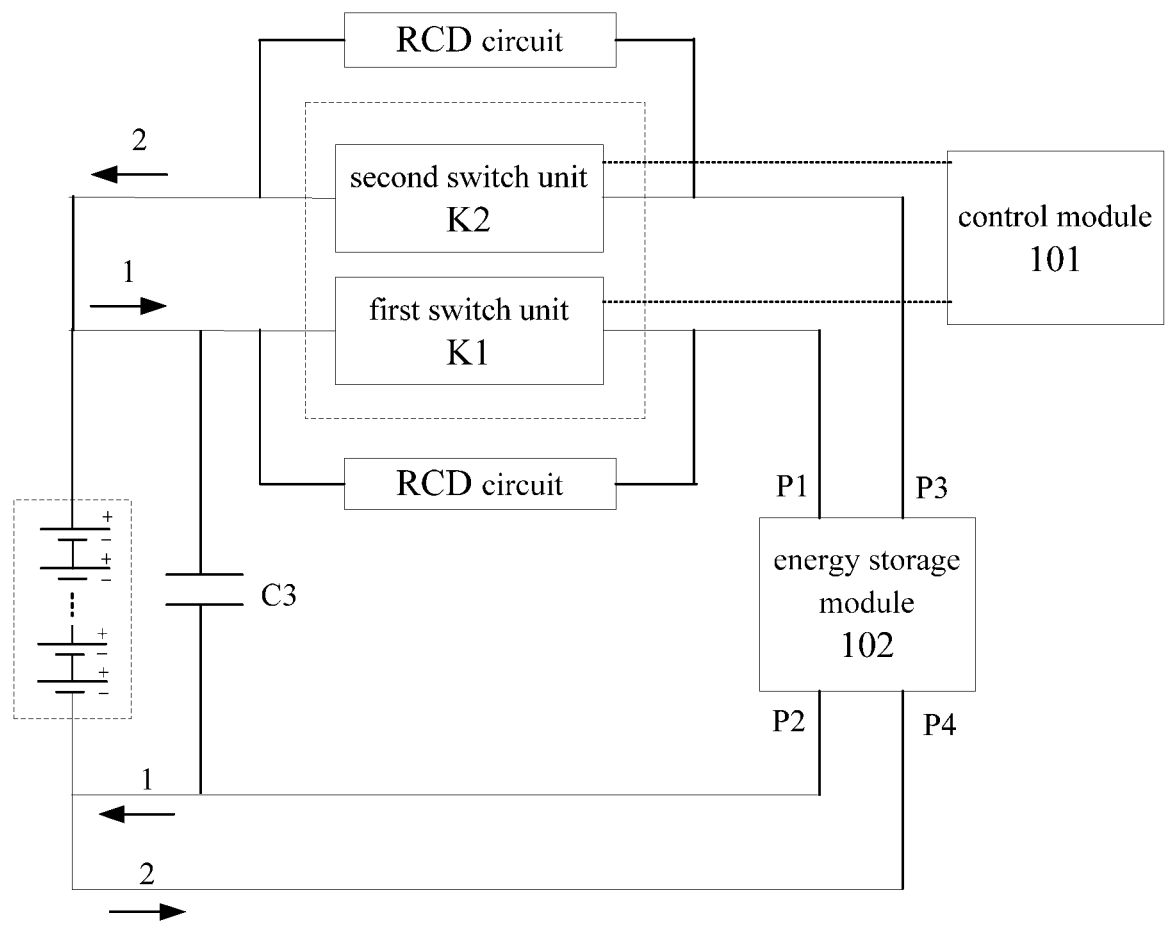
FIG. 7 is a schematic structural diagram of a heating system provided by a seventh embodiment of the present disclosure.

FIG. 7 is a schematic structural diagram of a heating system provided by a seventh embodiment of the present disclosure. The difference between FIG. 7 and FIG. 4 may be that, the heating system of FIG. 7 may further include an absorption capacitor C3.

Wherein, the absorption capacitor C3 may be connected in parallel to the two electrodes of the battery pack. The working principle of the absorption capacitor C3 may be described as follows.

When the heating system is started, the battery pack may first charge the absorption capacitor C3. Once a peak voltage generated during the switching off of the power switch device exceeds a blocking voltage of the power switch device, the peak voltage may be absorbed by a loop formed by the absorption capacitor C3 until the peak voltage and the battery pack voltage are at the same potential.

The suppression effect on the peak voltage will be more obvious if the capacitance value of the absorption capacitor C3 is larger. So, the absorption capacitor should be a large absorption capacitor with a large voltage value.

However, considering that the current may change suddenly when the power switch device is being switched off, which may cause a large current oscillation in the charge circuit. As the capacitance value of the absorption capacitor C3 increases, the current oscillation will also be increased, and even the over current will burn the power switch device. Therefore, it is necessary to test the absorption capacitor C3 according to the actual situation, and the absorption capacitor C3 should be selected based on the tradeoff between the suppression effect and the current oscillation.

Figure 8:
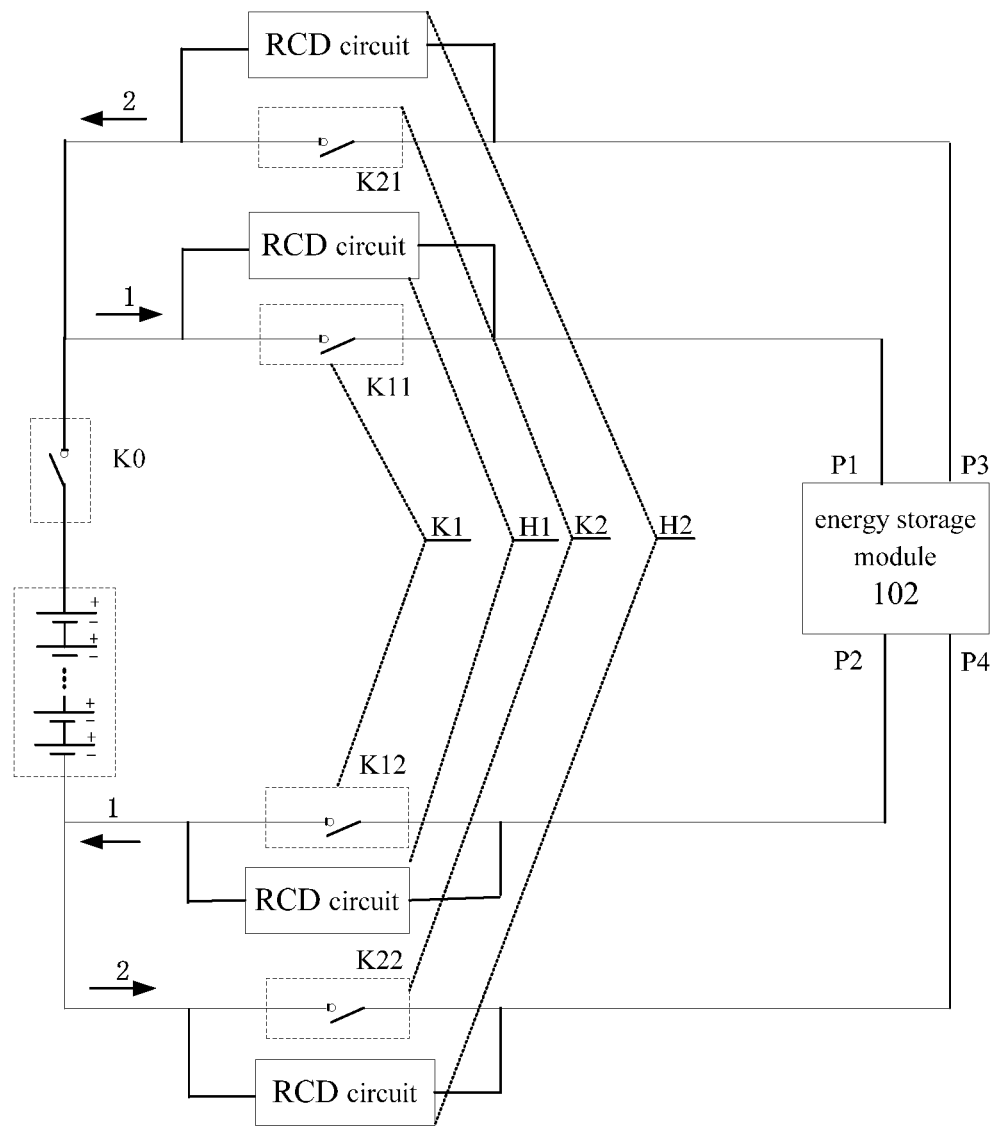
FIG. 8 is a schematic structural diagram of a heating system provided by an eighth embodiment of the present disclosure.

FIG. 8 is a schematic structural diagram of a heating system provided by an eighth embodiment of the present disclosure, which may be used to describe the technical solution in the embodiment of the present disclosure in detail in conjunction with FIG. 3.

As shown in FIG. 8, the heating system of the embodiment of the present disclosure may further include a buffer module. In order to prevent the above-mentioned power switch device from being subjected to a large peak voltage, the first buffer unit H1 may include two RC buffer circuits or two RCD buffer circuits, wherein one RC buffer circuit or one RCD buffer circuit may be connected in parallel to both ends of the first power switch device K11, and another RC buffer circuit or another RCD buffer circuit may be connected in parallel to both ends of the second power switch device K12. The second buffer unit H2 may include two RC buffer circuit or two RCD buffer circuit, wherein one RC buffer circuit or one RCD buffer circuit may be connected in parallel to both ends of the third power switch device K21, and another RC buffer circuit or another RCD buffer circuit may be connected in parallel to both ends of the fourth power switch device K22.

Wherein, K11 and K12 are used in the discharge circuit, and IGBT modules, multiple MOS tube parallel modules or SiC modules may be used due to the high switching frequency and large over current requirements. K21 and K22 are used in the charge circuit, and IGBT modules or SiC modules may be used, and even a quick recovery diode may be used according to functional design requirements.

FIG. 8 further illustrates K0 used as the main switch of the heating system. K0 may require a low switching frequency, and may be a relay Relay, an IGBT module or a MOS.

In order to facilitate the understanding by those skilled in the art, K11, K12, K21 and K22 may be equivalent to IGBT modules, and the application characteristics of the power switch device in the heating system will be described in detail in conjunction with FIG. 8.

In the embodiment of the present disclosure, when the heating system is in operation, the battery management system BMS may need to synchronously drive K11 and K12 and synchronously drive K21 and K22. However, in practical applications, the two IGBTs must have a timing difference of switching (on and off), making the voltage unbalanced.

Figure 9:
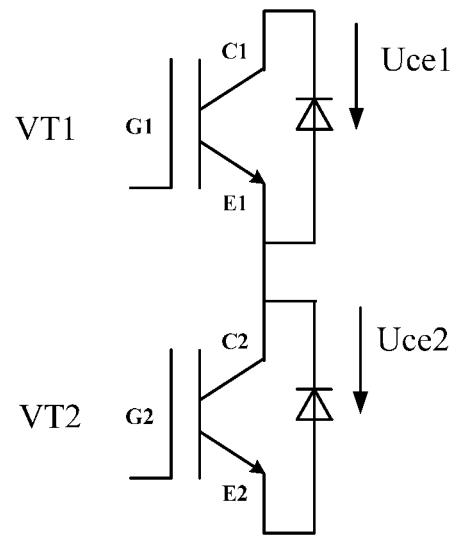
FIG. 9 is a schematic structural diagram of two IGBTs connected in series provided by a ninth embodiment of the present disclosure.

FIG. 9 is a schematic structural diagram of two IGBTs connected in series provided by a ninth embodiment of the present disclosure, which may be used for describing the principle of voltage imbalance between the power switch devices K11 and K12, or K21 and K22.

As shown in FIG. 9, VT1 and VT2 are connected in series. The voltage between the collector C1 and the emitter E1 of VT1 may be Uce1, and the voltage between the collector C2 and the emitter E2 of VT2 may be Uce2.

Due to the difference between the drive circuits of VT1 and VT2 and the devices themselves as well as the stray inductance, the voltage division between VT1 and VT2 may be uneven when being switched off, which may cause the switching off speeds of VT1 and VT2 being different.

Figure 10:
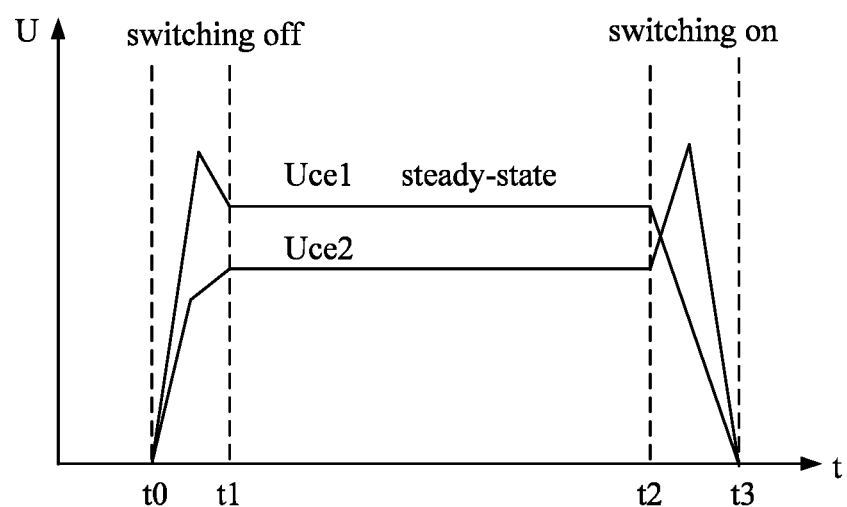
FIG. 10 is a schematic diagram illustrating changes in voltage between a collector and an emitter when VT1 and VT2 corresponding to FIG. 9 are being switched on and switched off.

FIG. 10 is a schematic diagram illustrating changes in voltage between a collector and an emitter when VT1 and VT2 corresponding to FIG. 9 are being switched on (turned on) and switched off (turned off).

As shown in FIG. 10, during the period of t0-t1, Uce1 and Uce1 are gradually increased, and the slope of Uce1 is greater than the slope of Uce2, indicating that the switching off speed of VT1 is greater than that of VT2.

During the period of t0-t1, Uce1 is gradually increased above the steady-state voltage, indicating that VT1 with a faster switching off speed is subjected to a higher voltage when being switched off.

During the period of t2-t3, Uce2 is first increased above the steady-state voltage and then begins to decrease, indicating that VT2 with a faster switching on speed is subjected to a higher voltage when being switched on.

At the same time, in an on-board system, due to space constraints, the battery pack must be connected to the heating system via a certain length of wire harness. Due to the stray inductance on the power supply wire harness and the energy storage module 102, voltage overshoot may be generated when the IGBT is being switched off.

In one embodiment, the working voltage of K11, K12, K21, and K22 should be greater than a threshold voltage, and the threshold voltage may be a peak voltage generated due to a stray inductance of a wire harness between the battery pack and each power switch device when switching between the discharge circuit and the charge circuit.

Specifically, the peak voltage $V_{peak}$ may be obtained by the following equation, namely:

$$V_{peak} = Vdd + (L_1 + L_2) \times \frac{\Delta I}{\Delta t} \quad (1)$$

wherein Vdd is a voltage value of the battery pack, $L_1$ is an inductance value of the energy storage module 102, $L_2$ is the stray inductance of the wire harness between the battery pack and the power switch device, $\Delta t$ is a duration during which current magnitude and current direction change suddenly when switching between the discharge circuit and the charge circuit, and $\Delta I$ is a current change value within the $\Delta t$.

In an example, assuming that the stray inductance value of the battery pack to K11 is L2=0.4 uH. When the energy storage module 102 is an inductance device, the inductance of the inductance device may be L1=1 uH. The voltage range of the battery pack of a bus is usually 400~700V, so the battery pack voltage may be Vdd=400V.

Considering that when K11 is being switched off, the energy storage module 102 E1 is being switched from the discharge circuit to the charge circuit, and the current direction changes. $\Delta I$ is large, which may be set to $\Delta I$=400 A, and the current decreasing time is short, usually in practical application, the duration during which the current magnitude and the current direction of current I change suddenly may be $\Delta t$=1 us.

Substituting the above parameter values into equation (1) gives:

$$V_{peak} = 400 + 1.4 \ast 400/1 = 960 \text{ V} \quad (2)$$

In the embodiment of the present disclosure, in order to leave a part of the margin for the design, considering a plurality of factors such as voltage platform, power switch devices of 1200V or more may be preferred on the bus vehicle.

In addition, the voltage platform of the car vehicle may usually be 200~400V, and the wire harness in the car is shorter and the stray inductance is smaller, so $V_{peak}$ should be less than 960V. Power switch devices of 600~4200V may be preferred on the car vehicle platform. Of course, the specific design needs to be determined by actual testing.

In the embodiment of the present disclosure, in order to be able to avoid the short circuit and the overload current, K11 and K12, K21 and K22 should be ideally synchronous when being switched on and off. Therefore, it is preferable to select power switch devices of the same batch, the same specification and the same manufacturer.

The last and most important way to properly use power switch devices is to design a reasonable drive circuit. The following is a detailed analysis of the drive circuit of the IGBT. The drive circuit mentioned here is also partially applicable to other power switch devices.

A reasonable drive circuit may need to implement the function of preventing the IGBT from short circuit and overvoltage. Using the IGBT as an example, the implementation of the drive circuit of the IGBT will be described in detail below.

In the heating system of the battery pack, the drive circuit of the IGBT may first need to consider the maximum peak current $I_{max}$ of the IGBT.

The maximum peak current $I_{max}$ of the IGBT may be estimated using equation (3).

$$I_{max} = \frac{\Delta U_{ge}}{R_{gmin}} \times 0.74 = 0.74 \times \frac{U_{gemax} - U_{gemin}}{R_{gin} + R_{gext}} \quad (3)$$

Wherein, $I_{max}$ is the peak current output by the driver IC, $U_{gemax}$ is the positive gate voltage of the IGBT when being switched on, $U_{gemin}$ is the negative gate voltage of the IGBT when being switched off, and the value of $U_{gemax}$ and $U_{gemin}$ is generally in the range of −20V~+20V, $R_{gin}$ is the internal gate resistance of the IGBT which is in the range of 0.8-1.2Ω, and $R_{gext}$ is the gate resistance applied by the external drive circuit.

$R_{gext}$ is one of the key parts of the design of the drive circuit. The switching performance and loss of the IGBT depends on the value of $R_{gext}$. Therefore, the value of $R_{gext}$ needs to be selected according to different types of IGBTs and dynamically adjusted by actual testing.

In equation (3), 0.74 is a correction factor, and the derivation process may be as follows.

Considering the existence of internal parasitic resistance and inductance, when the IGBT is being switched on and off, the internal parasitic capacitance $C_{ge}$ of the IGBT may be considered to be constant, and the differential equation of the RLC circuit composed of the internal parasitic inductance $L_g$ and the stray inductances $L_{gon}$ and $L_{goff}$ of the lead wire of the gate may be:

$$L\frac{d^2 i_g(t)}{dt^2} + R_g \frac{di_g(t)}{dt} + \frac{i_g(t)}{C_{ge}} = 0 \quad (4)$$

Wherein, $L = L_{gon} L_{goff}$ which is the sum of the stray inductances of the lead wire of the gate, $R_g = R_{gin} R_{gext}$ which is the sum of the internal and external gate resistances, and $i_g(t)$ is the gate current that changes over time.

Solving equation (3) may obtain:

$$I_{max} = \frac{\Delta U_{ge}}{R_{gmin}} \ast \frac{2}{e} \quad (5)$$

$$R_{gmin} \geq 2\sqrt{\frac{L_{gadd}}{C_{ge}}} \quad (6)$$

Wherein, $$\frac{2}{e}$$

is the correction factor which equals to 0.74; $R_{gmin}$ is the minimum gate resistance in the gate that does not cause oscillation, $L_{gadd} = L_g + L_{gon}$, or $L_{gadd} = L_g + L_{goff}$.

In the above derivation, it can also be found that if $L_{gadd}$ is large, that is, the gate drive wire is long, the value of $R_{gmin}$ must also be increased, such that the problem of jumping of the gate freewheeling diode may be avoided.

Figure 11:
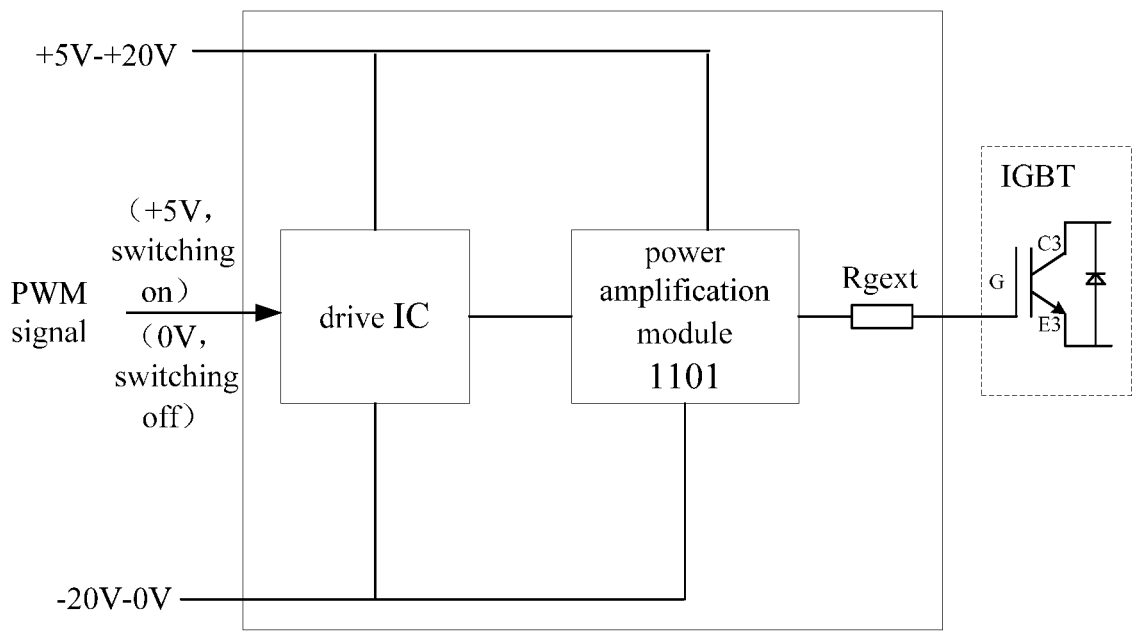
FIG. 11 is a schematic structural diagram of a power switch device provided by a tenth embodiment of the present disclosure.

FIG. 11 is a schematic structural diagram of a power switch device provided by a tenth embodiment of the present disclosure. As shown in FIG. 11, the power switch device may include an IGBT and a drive circuit for driving the IGBT. The drive circuit may include a drive IC and an external gate resistor $R_{gext}$ connected to the drive IC, the external gate resistor $R_{gext}$ is connected to the gate G of the IGBT.

As shown in FIG. 11, the heating system may further include a power amplification module 1101 for meeting a demand for the power switch device (e.g., the IGBT) for a large drive current.

The power amplification module 1101 may be disposed between the drive IC and the external gate resistor $R_{gext}$, and the power amplification module 1101 may include a single-stage or multi-stage power amplification circuit for amplifying a current output by the drive IC to meet the demand of the IGBT for a large drive current.

Figure 12:
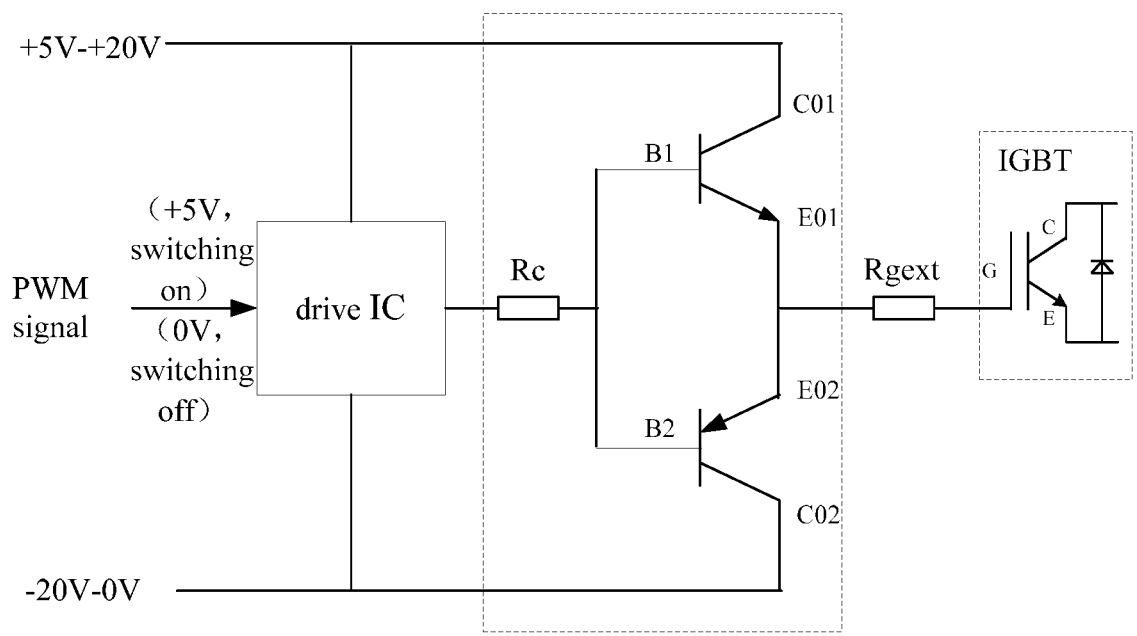
FIG. 12 is a schematic structural diagram of a power switch device provided by an eleventh embodiment of the present disclosure.

FIG. 12 is a schematic structural diagram of a power switch device provided by an eleventh embodiment of the present disclosure, which is used to illustrate the specific components of a power amplification circuit. As shown in FIG. 12, the power amplification circuit may include a NPN triode and a PNP triode.

Wherein, an output end of the drive IC may be respectively connected to a base B1 of the NPN triode and a base B2 of the PNP triode. A collector C01 of the NPN triode may be respectively connected to a positive DC voltage source (+5V~+20V) and the drive IC. A collector C02 of the PNP triode may be respectively connected to a negative DC voltage source (−20V~0V) and the drive IC. An emitter of the NPN triode and an emitter of the PNP triode are both connected to the external gate resistor $R_{gext}$.

In one embodiment, as shown in FIG. 12, the power amplification circuit may further include an amplification resistor Rc. One end of the amplification resistor Rc may be connected to the output end of the drive IC, and another end of the amplification resistor Rc may be respectively connected to the base B1 of the NPN transistor and the base B2 of the PNP transistor.

The working principle of the power amplification circuit shown in FIG. 12 may be as follows.

When the drive IC receives a high-level switching on signal (+5V) of the control module 101, it may output a positive drive current to Rc, and the collector C01 and the emitter E01 of the NPN transistor may be switched on, such that the level between the gate G and the emitter E of the IGBT may be pulled to +5V~+20V, resulting that the IGBT is switched on.

When the drive IC receives a low-level switching off signal (0V) of the control module 101, it may output a negative drive current to Rc, and the collector C02 and the emitter E02 of the PNP transistor may be switched off, such that the level between the gate G and the emitter E of the IGBT may be pulled to −20V~0V, resulting that the IGBT is switched off.

It should be noted that, FIG. 12 only illustrates the topological structure of the single-stage power amplification circuit. The driving capability for the IGBT may further be improved via the multi-stage power amplification circuit. Of course, those skilled in the art may also implement driving of the IGBT by using other types of power amplification circuits according to actual needs, which is not limited herein.

In order to facilitate the implementation of the embodiments by the person skilled in the art, the parameter selection of each component in FIG. 12 will be described in detail below.

S1, the peak current $I_{max}$ required to drive the IGBT may be calculated using the formula (3).

S2, the NPN and PNP of large package may be selected, and the maximum current of each boost stage may be considered. If there is only one boost stage, the maximum current and the peak current obtained by S1 may be the same; If there are multiple boost stages, multiple boost stages may be connected in parallel, and the resistance value of the $R_{gext}$ may be calculated according to the current supplied by each boost stage and the number of the boost stages.

S3, the current transmission ratio $h_e$ of the triode may be determined according to the data sheet of the selected NPN and PNP, the base current $I_{b1}$ of the NPN transistor and the base current $I_{b2}$ of the PNP transistor may be calculated using $$\frac{I_{peak}}{h_e},$$

and then the resistance value of the $R_c$ may be calculated according to the voltage value $\Delta V_{ge}$ used for driving the IGBT.

Combined with the above analysis, in the discharge circuit, the voltage division of the devices may be uneven due to the different synchronization characteristics of K11 and K12. Therefore, the drive ICs and the drive circuits of K11 and K12 should be identical in design. The PCB design should also be highly symmetric, and the wire between the drive board and the IGBT should be as symmetric as possible. The value of the drive resistor should be corrected according to the actual testing. In the present design, the value of $R_{gext}$ may be set as 1.5~3.8Ω, the value of $R_c$ may be set as 30~180Ω.

In the rapid heating system of the battery pack, the use of the power switch device is slightly different from that of other conventional systems. The three measures mentioned above are not used separately in the system, and are combined to implement the application of the large power switch device in the rapid heating system of the battery pack.

It should be clear that the embodiments in this specification are described in a progressive manner, and the same or similar parts in each embodiment may be referred to each other, and each embodiment focuses on the difference from other embodiments. For device embodiments, relevant parts can be referred to the description of the method embodiments. The embodiments of the present disclosure are not limited to the specific steps and structures described above and shown in the drawings. Those skilled in the art can make various changes, modifications and additions or changing the order between steps after understanding the spirit of the embodiments of the present disclosure. Also, for the sake of brevity, detailed descriptions of known methods and techniques are omitted here.

The functional blocks shown in the block diagrams described above may be implemented as hardware, software, firmware, or a combination thereof. When implemented in hardware, it may be, for example, an electronic circuit, an application specific integrated circuit (ASIC), suitable firmware, plug-ins, function cards, and the like. When implemented in software, the elements of an embodiment of the present disclosure are programs or code segments that are used to perform the required tasks. Programs or code segments may be stored on a machine-readable medium or transmitted over a transmission medium or communication link via a data signal carried in a carrier wave. The "machine-readable medium" may include any medium that is capable of storing or transmitting information. Examples of machine-readable media include electronic circuitry, semiconductor memory devices, ROMs, flash memory, erasable ROM (EROM), floppy disks, CD-ROMs, optical disks, hard disks, fiber optic media, radio frequency (RF) links, and the like. The code segments may be downloaded via a computer network such as the Internet, an intranet or the like.

The embodiments of the present disclosure may be implemented in other specific forms without departing from its spirit and essential characteristics. For example, the algorithms described in the specific embodiments may be modified without system architecture departing from the basic spirit of the embodiments of the present disclosure. As such, the embodiments are to be considered in all respects as illustrative and not restrictive, and the scope of the embodiments of the disclosure is defined by the appended claims rather than the foregoing descriptions. All changes that are defined in the meaning and the equivalents of the claims come within the scope of the embodiments of the disclosure.

What is claimed is:

1. A heating system, comprising: a battery pack, an energy storage module, a switch module, a control module, and a buffer module; wherein
the switch module comprises a first switch unit and a second switch unit;
the control module controls that the first switch unit is switched on and the second switch unit is switched off, so that the battery pack, the first switch unit and the energy storage module form a discharge circuit;
the control module controls that the first switch unit is switched off and the second switch unit is switched on, so that the energy storage module, the second switch unit and the battery pack form a charge circuit;
the buffer module comprises a first buffer unit and a second buffer unit, wherein the first buffer unit is connected in parallel to both ends of the first switch unit for providing a short-time path when the first switch unit is being switched on or switched off; and the second buffer unit is connected in parallel to both ends of the second switch unit for providing a short-time path when the second switch unit is being switched on or switched off.

2. The heating system according to claim 1, wherein:
the first buffer unit comprises a RC buffer circuit or a RCD buffer circuit, and the RC buffer circuit or the RCD buffer circuit is connected in parallel to both ends of the first switch unit;
the second buffer unit comprises a RC buffer circuit or a RCD buffer circuit, and the RC buffer circuit or the RCD buffer circuit is connected in parallel to both ends of the second switch unit.

3. The heating system according to claim 2, wherein the RCD buffer circuit comprises a resistor, a capacitor and a diode;
when the RCD buffer circuit is connected in parallel to both ends of the first switch unit, a first end of the capacitor is connected to a first end of the first switch unit, a second end of the capacitor is connected to an input end of the diode, an output end of the diode is connected to a second end of the first switch unit, and the resistor is connected in parallel to both ends of the capacitor;
when the RCD buffer circuit is connected in parallel to both ends of the second switch unit, a first end of the capacitor is connected to a first end of the second switch unit, a second end of the capacitor is connected to an output end of the diode, an input end of the diode is connected to a second end of the second switch unit, and the resistor is connected in parallel to both ends of the capacitor.

4. The heating system according to claim 1, wherein the heating system further comprises an absorption capacitor connected in parallel to two electrodes of the battery pack.

5. The heating system according to claim 1, wherein the first switch unit comprises a first power switch device and a second power switch device, the second switch unit comprises a third power switch device and a fourth power switch device, and the energy storage module comprises a first end, a second end, a third end, and a fourth end;
two ends of the first power switch device are respectively connected to a positive electrode of the battery pack and the first end of the energy storage module, two ends of the second power switch device are respectively connected to a negative electrode of the battery pack and the second end of the energy storage module, two ends of the third power switch device are respectively connected to the positive electrode of the battery pack and the third end of the energy storage module, and two ends of the fourth power switch device are respectively connected to the negative electrode of the battery pack and the fourth end of the energy storage module;
the control module controls that the first power switch device and the second power switch device are synchronously switched on and the third power switch device and the fourth power switch device are synchronously switched off, so that the battery pack and the energy storage module form a discharge circuit;
the control module controls that the first power switch device and the second power switch device are synchronously switched off and the third power switch device and the fourth power switch device are synchronously switched on, so that the energy storage module and the battery pack form a charge circuit;
the first buffer unit comprises two RC buffer circuits or two RCD buffer circuits, wherein one RC buffer circuit or one RCD buffer circuit is connected in parallel to both ends of the first power switch device, and another RC buffer circuit or another RCD buffer circuit is connected in parallel to both ends of the second power switch device;
the second buffer unit comprises two RC buffer circuits or two RCD buffer circuits, wherein one RC buffer circuit or one RCD buffer circuit is connected in parallel to both ends of the third power switch device, and another RC buffer circuit or another RCD buffer circuit is connected in parallel to both ends of the fourth power switch device.

6. The heating system according to claim 5, wherein a working voltage of the first power switch device, the second power switch device, the third power switch device, and the fourth power switch device is greater than a threshold voltage, and the threshold voltage is a peak voltage generated due to a stray inductance of a wire harness between the battery pack and each power switch device when switching between the discharge circuit and the charge circuit.

7. The heating system according to claim 6, wherein the peak voltage $V_{peak}$ is:

$$V_{peak} = Vdd + (L_1 + L_2) \times \frac{\Delta I}{\Delta t}$$

wherein Vdd is a voltage value of the battery pack, $L_1$ is an inductance value of the energy storage module, $L_2$ is the stray inductance of the wire harness between the battery pack and the power switch device, $\Delta t$ is a duration during which a current magnitude and a current direction change suddenly when switching between the discharge circuit and the charge circuit, and ΔI is a current change value within the Δt.

8. The heating system according to claim 5, wherein the power switch device comprises an insulated gate bipolar transistor IGBT and a drive circuit for driving the IGBT, the drive circuit comprises a drive IC and an external gate resistor connected to the drive IC, the external gate resistor is connected to a gate of the IGBT, and the heating system further comprises a power amplification module;

the power amplification module is disposed between the drive IC and the external gate resistor, and the power amplification module comprises a single-stage or multi-stage power amplification circuit for amplifying a current output by the drive IC to meet a demand of the IGBT for a large drive current.

9. The heating system according to claim 8, wherein the power amplification circuit comprises: a NPN triode and a PNP triode; wherein, an output end of the drive IC is respectively connected to a base of the NPN triode and a base of the PNP triode;

a collector of the NPN triode is respectively connected to a positive DC voltage source and the drive IC;

a collector of the PNP triode is respectively connected to a negative DC voltage source and the drive IC;

an emitter of the NPN triode and an emitter of the PNP triode are both connected to the external gate resistor.

10. The heating system according to claim 9, wherein the power amplification circuit further comprises an amplification resistor, one end of the amplification resistor is connected to the output end of the drive IC, and another end of the amplification resistor is respectively connected to the base of the NPN triode and the base of the PNP triode.

\* \* \* \* \*